United States Patent
Bingi et al.

(10) Patent No.: US 7,120,811 B1
(45) Date of Patent: Oct. 10, 2006

(54) METHOD AND APPARATUS FOR DETECTION OF A POWER MANAGEMENT STATE BASED ON A POWER CONTROL SIGNAL CONTROLLING MAIN POWER TO THE COMPUTER SYSTEM AND A POWER CONTROL SIGNAL CONTROLLING POWER TO SYSTEM MEMORY AND WAKING UP THEREFROM

(75) Inventors: Ravi B. Bingi, Austin, TX (US); John Dambik, Austin, TX (US); Brian E. Longhenry, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 540 days.

(21) Appl. No.: 10/230,715

(22) Filed: Aug. 29, 2002

(51) Int. Cl.
*G06F 1/32* (2006.01)
*G11C 11/4074* (2006.01)
*G06F 11/30* (2006.01)

(52) U.S. Cl. .................. 713/324; 713/300; 713/340
(58) Field of Classification Search ............. 713/300, 713/320, 340
See application file for complete search history.

(56) References Cited

U.S. PATENT DOCUMENTS

| | | | | |
|---|---|---|---|---|
| 5,341,179 A | * | 8/1994 | Konishi | 348/730 |
| 5,694,607 A | * | 12/1997 | Dunstan et al. | 713/340 |
| 5,787,293 A | * | 7/1998 | Kim et al. | 713/300 |
| 6,219,795 B1 | * | 4/2001 | Klein | 713/300 |
| 6,275,947 B1 | | 8/2001 | Wang | |
| 6,321,341 B1 | * | 11/2001 | Kamijo et al. | 713/340 |
| 6,658,576 B1 | * | 12/2003 | Lee | 713/320 |

OTHER PUBLICATIONS

Intel Microsoft Toshiba, "Advanced Configuration and Power Interface Specification," Revision 1.0b, Feb. 2, 1999, pp. 1-329.

* cited by examiner

Primary Examiner—Lynne H. Browne
Assistant Examiner—Anand B. Patel
(74) Attorney, Agent, or Firm—Zagorin O'Brien Graham LLP

(57) ABSTRACT

Power control signals for main power and RAM power are utilized to determine when the system is in the suspend to RAM state. Once the system is determined to be in the suspend to RAM state state, a control circuit detects peripheral activity, such as activity of a mouse or a keyboard, and generate a wake-up signal.

20 Claims, 5 Drawing Sheets

METHOD AND APPARATUS FOR DETECTION OF A POWER MANAGEMENT STATE BASED ON A POWER CONTROL SIGNAL CONTROLLING MAIN POWER TO THE COMPUTER SYSTEM AND A POWER CONTROL SIGNAL CONTROLLING POWER TO SYSTEM MEMORY AND WAKING UP THEREFROM

BACKGROUND

1. Field of the Invention

This invention relates to computer systems and more particularly to power management of computer systems.

2. Description of the Related Art

Power consumption and associated performance and thermal issues are considerations for every computer system design. Many power saving techniques have been introduced to save power. Power management in older personal computer systems was typically implemented using microcontrollers and/or proprietary use of the system management mode (SMM). Current x86 based computer systems utilize an industry supported power management approach described in the Advanced Configuration and Power Interface Specification (ACPI). The ACPI specification enables an operating system (OS) controlled power management scheme. As part of that power management approach, ACPI specifies processor and device power states and system sleep states. One such state specified by ACPI is the S3 or suspend to RAM state where the state of the machine is saved to RAM. When in the S3 state, activity on peripheral devices such as a keyboard or mouse causes the device to wake from the S3 state. Accordingly, even though the system is in a low-power state, the system has to provide power to maintain system state in RAM as well as to power sufficient logic to detect peripheral activity and cause the system to wake from the S3 state. Other reduced power states include suspend to disk (STD), in which system context is saved to non volatile memory such as the hard disk and soft off.

It would be desirable to be able to provide a cost effective solution to detect the existence of the S3 state and to provide a mechanism to detect a wake-up event that is cost effective, requires few parts and can be implemented in the motherboard or integrated into the chipset.

SUMMARY

According to the present invention, power control signals are utilized to determine when the system is in the S3 state. Once the system is determined to be in the S3 state, a control circuit can be utilized to detect peripheral activity, such as activity of a mouse or a keyboard, and generate a wake-up signal.

In one embodiment, a method is provided that includes detecting a power management state according to a value of a first power control signal indicative of a power state for main power for a computer system and according to a value of a second power control signal indicative of a power state for system memory. The method further includes supplying a power management state signal indicative of the power management state. The power state management state detected is a suspend to RAM (S3) power state. The method may further include responding to the existence of a resume event to generate a wake-up signal during the suspend to RAM power state, wherein the resume event is indicated by one or more signals indicative of activity, respectively, of one or more peripheral devices. Examples of such signals indicative of peripheral activity are the keyboard clock and the mouse clock.

In another embodiment the invention provides an apparatus that includes a first circuit coupled to logically combine a first power control signal indicative of a power state for main power of a computer system and a second power control signal indicative of a power state for system memory and to generate an indication of detection of a power management state. The power state management state is a suspend to RAM power state in which system context is stored in the system memory. An apparatus may be further coupled to receive one or more signals indicative of activity of one or more peripheral devices and to supply a wake-up signal in response thereto.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
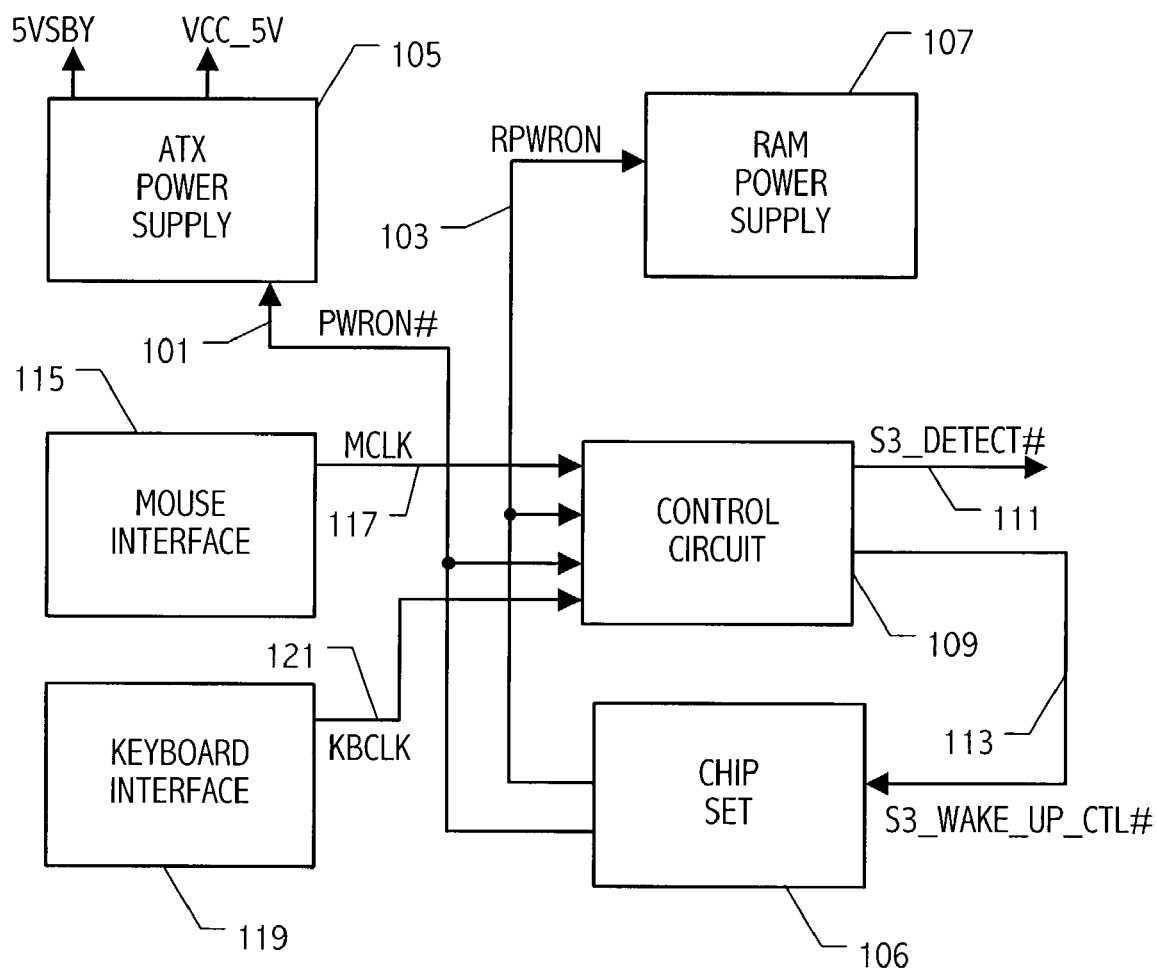
FIG. 1 shows a block diagram of a system incorporating an embodiment of the present invention.

Referring to FIG. 1, a block diagram of a portion of a computer system is shown that incorporates an embodiment of the present invention. The signals "power on" (PWRON#) conveyed on node 101 and "RAM Power On" (RPWRON) conveyed on node 103 control the power supply (an ATX power supply in one embodiment) and the RAM power supply, respectively. In the illustrated embodiment, the power supply supplies main power (including VCC_5V, VCC_3V, VCC_12V & VCC_12_NEG), which are ON during system operation in the working state (S0 in ACPI). In addition, the 5 volt standby power (5VSBY) and the RAM power supply planes are ON during operation of the computer system in the working state.

Figure 2:
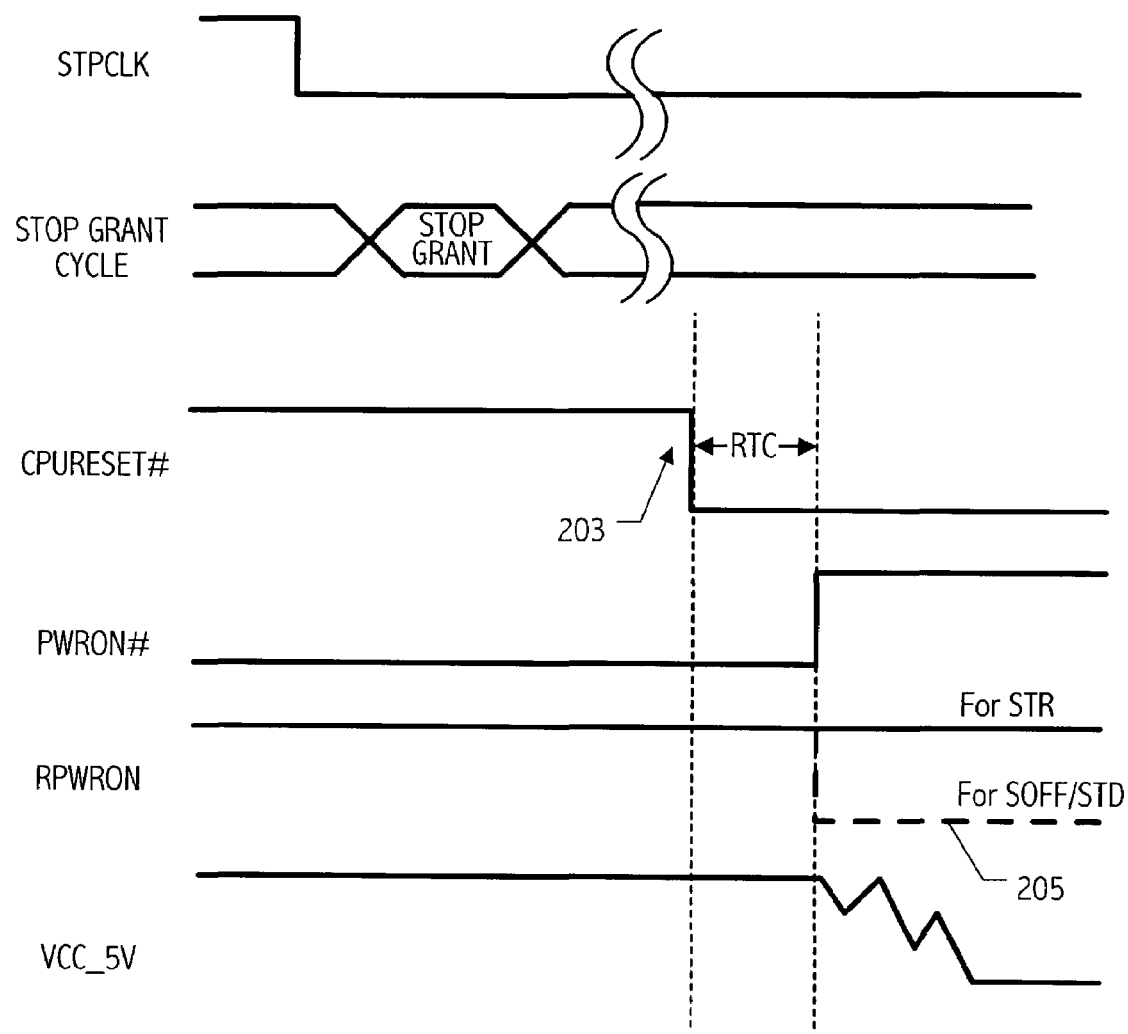
FIG. 2 illustrates waveforms illustrating a typical power management transition from full on (FON) to a different power management state (STR/STD/SOFF).

Referring to FIG. 2, the timing diagram illustrates a typical power management transition from Full on (FON) to the suspend to RAM (STR) (or S3) state. In the S3 state, the system's context is stored in system memory, which remains powered during the S3 state. On an S3 Power Management Event, after the processor STPCLK & Stop Grant cycles, the system asserts a CPURESET# signal at 203, where the "#" indicates an active low signal. Approximately one real time clock (RTC), after assertion of the CPURESET# signal, depending on the chipset, the chipset deasserts PWRON# by raising PWRON# to a 'high' level. Referring again to FIG.

1, deasserting PWRON# shuts OFF the main power supplied by the ATX power supply 105, while the RAM power-supply 107 remains ON. In the ACPI S3 state, the 5VSBY and the RAM power supply planes are powered ON while the main supplies (VCC_5V, VCC_3V, VCC_12V & VCC_12_NEG) are powered OFF. The control circuit 109 detects the existence of the S3 state based on the value of the PWRON# (unasserted during S3) and RPWRON (asserted during S3) and supplies a signal (S3_DETECT#) on node 111 indicating the existence of the S3 state when asserted. Note that for the soft off (SOFF) and the suspend to disk (STD) states, the RAM power plane is OFF as indicated in FIG. 2 at 205.

When in the S3 state, the chipset 106, e.g., a South Bridge or I/O Hub integrated circuit, asserts specific signals to keep system RAM data alive and perform power management functions as required by the S3 state. More particularly, the chipset 106 generates a deasserted PWRON# and an asserted RPWRON during the S3 state. The control circuit 109 detects the Suspend to RAM (STR) state using the PWRON# and RPWRON chipset outputs and asserts a chipset input to wake-up the system from the S3 state upon receiving a resume event from a peripheral device. During the S3 state, the control circuit 109 monitors the activity of peripheral devices such as a mouse or keyboard and when such activity is detected, which constitutes a resume event, causes a wake-up signal (S3_WAKE_UP_CTL#) to be asserted on node 113. In the embodiment illustrated in FIG. 1, the indication of activity from the mouse interface 115 is supplied by the mouse clock (MCLK) 117. The indication of activity from the keyboard interface 119 is provided by the keyboard clock 121. Whenever there is keyboard or mouse activity (i.e when one clicks/presses the mouse/keyboard or moves the mouse), the keyboard clock or the mouse clock is generated. The keyboard clock and the mouse clock are not free running outputs from the keyboard interface or mouse interface. Instead, they are output only when there is keyboard/mouse activity. The mouse clock and the keyboard clock are 12 KHz signals in the illustrated embodiment.

Figure 3:
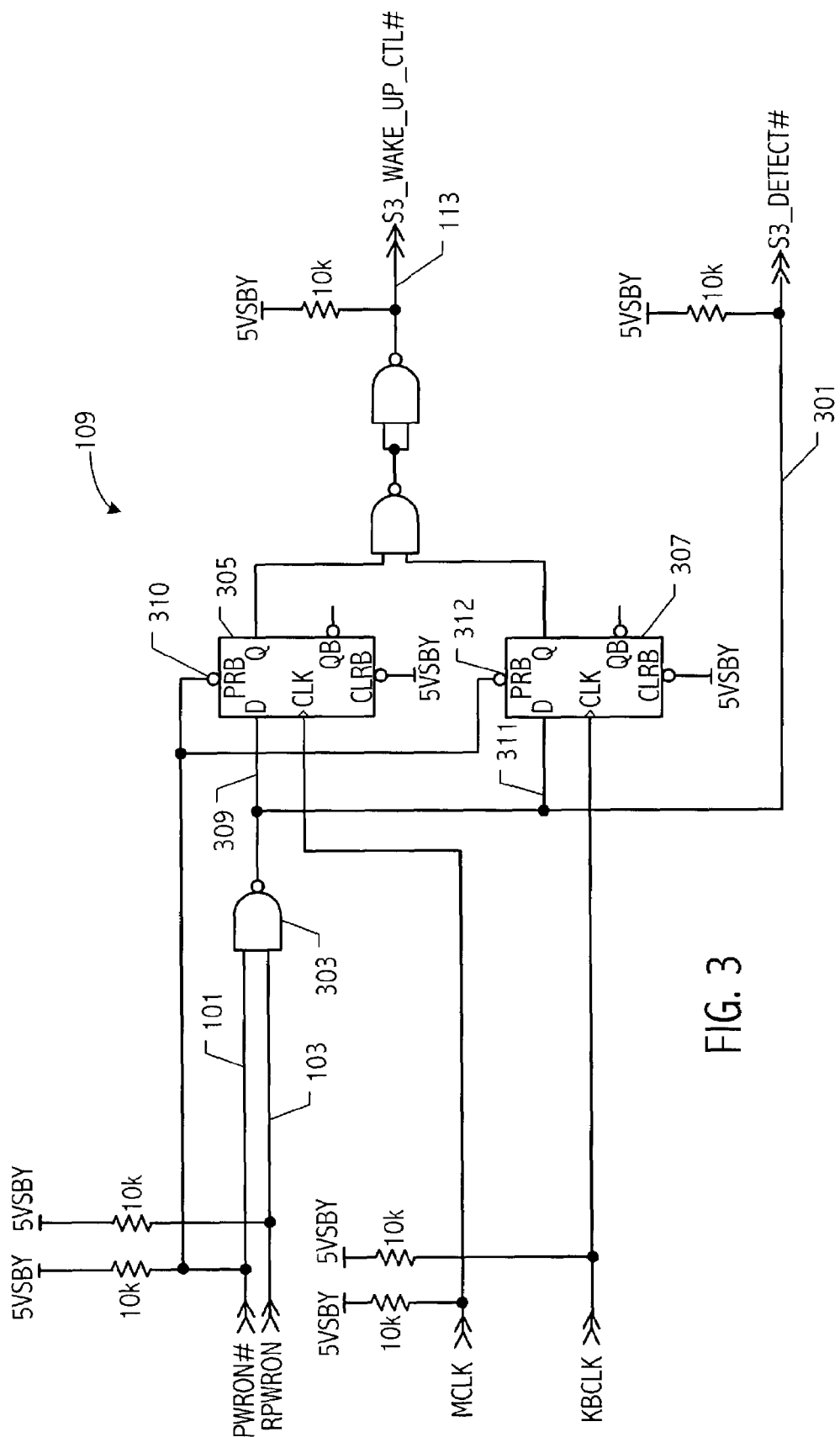
FIG. 3 illustrates a circuit that detects the S3 state and generates a wake-up signal in accordance with one embodiment of the invention.

Referring now to FIG. 3, one embodiment for control circuit 109 is illustrated for detecting the S3 state and causing a system wake-up based on either mouse or keyboard activity. In the FON state the PWRON# signal is asserted ("low"), the D flip-flops 305 and 307 are 'Preset' and the S3_WAKE_UP_CTL# signal (active low), which is supplied to chipset 106 on node 113, is held "high". In all ACPI power management states other than the S3 state, the data inputs on nodes 309 and 311, to the D flop-flops 305 and 307 are held "high". Therefore, the use of keyboard or mouse does not generate an asserted S3_WAKE_UP_CTL# signal since the S3_WAKE_UP_CTL# signal remains 'High'.

When the system enters the S3 state, the data inputs 309 and 311 of the D flip-flops 305 and 307 transition to a 'low' level (since PWRON# and RPWRON are both "high"). The 'Preset' inputs 310 and 312 change to a 'High' level. On a resume event from the mouse (i.e., on a mouse movement or click), the MCLK is generated and the D flip-flops transfer their data inputs to the outputs. This generates an active 'Low' S3_WAKE_UP_CTL# signal.

Figure 4:
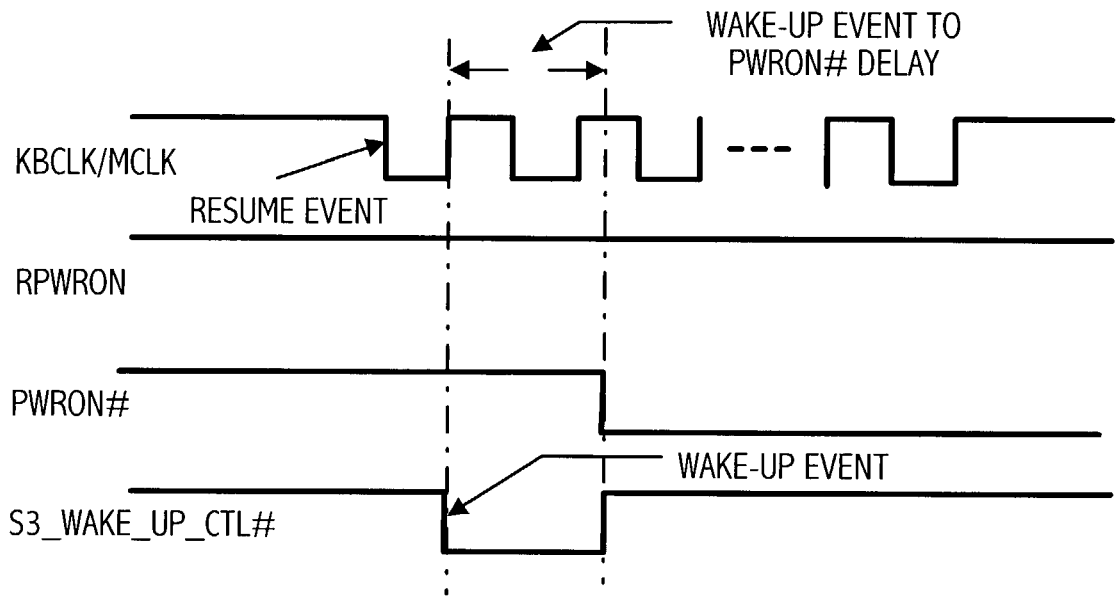
FIG. 4 illustrates a timing diagram illustrating the operation of the circuit shown in FIG. 3.

FIG. 4 is a timing diagram illustrating the operation of the circuit shown in FIG. 3. Note that the duration of the S3_WAKE_UP_CTL# signal is independent of the MCLK period and is dependent only on the delay between the wake-up event to the chipset and the assertion of the PWRON# by the chipset. When the chipset asserts the active 'low' PWRON# signal, the main supplies are turned ON, the D flip-flops are again 'Preset' and the S3_WAKE_UP_CTL# signal transitions to a 'high' level. The wakeup procedure described above is the same for a resume-event generated from the keyboard (i.e., on a key press). The embodiment illustrated in FIG. 3 works regardless of the duration of the delay between the wake-up event to the chipset and assertion of the PWRON# by the chipset.

Figure 6:
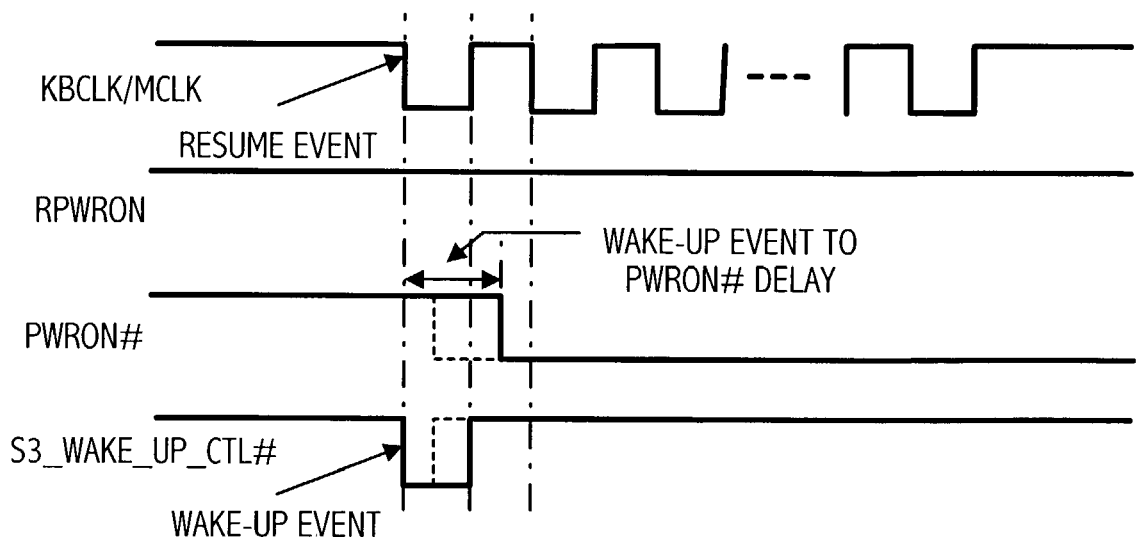
FIG. 6 illustrates a timing diagram illustrating the operation of the circuit shown in FIG. 5.
Figure 5:
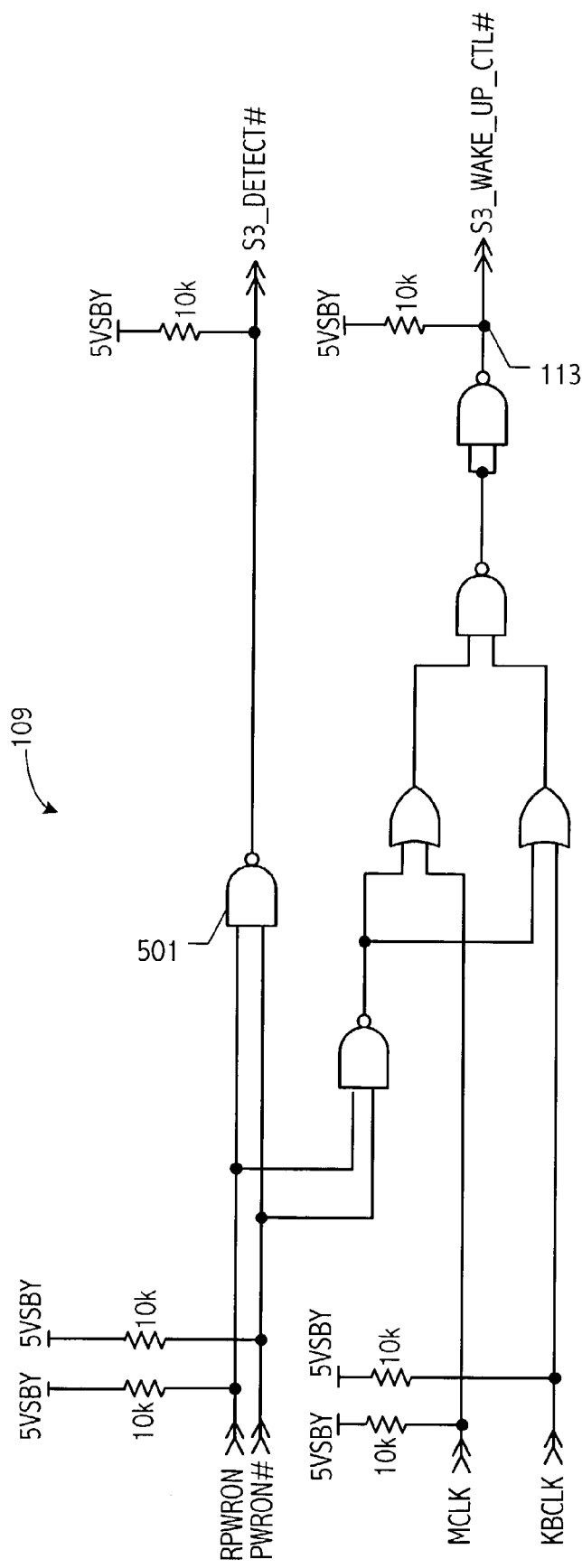
FIG. 5 illustrates a circuit that detects the S3 state and generates a wake-up signal in accordance with another embodiment of the invention.

FIG. 5 shows an alternative implementation for control circuit 109 using only combinatorial logic. FIG. 6 is a timing diagram illustrating operation of that circuit. The active low S3_DETECT# signal is again generated using a NAND gate 501. Note that MCLK and KBCLK are connected to pull-up resistors such that when the clock goes low, the S3_WAKE_UP_CTL# signal pulses when in the S3 state. If the delay between the wake-up event to the assertion of PWRON# is less than one MCLK/KBCLK period, the circuit generates a single S3_WAKE_UP_CTL# pulse of duration less than or equal to one-half of the MCLK or KBCLK period. If the delay between the wake-up event to the assertion of PWRON# is more than one MCLK/KBCLK period, the circuit generates multiple S3 WAKE_UP_CTL# pulses. The embodiment illustrated in FIG. 5 can be used if the chipset ignores the subsequent S3_WAKE_UP_CTL# pulses after the first S3_WAKE_UP_CTL# pulse or is otherwise insensitive to them. If the chipset requires a single S3_WAKE_UP_CTL# pulse, the use of the embodiment in FIG. 5 requires assurance that the delay between the wake-up event to the chipset and the assertion of the PWRON# by the chipset is less than the KBCLK and MCLK period.

The various embodiments for the control circuits detailed above for S3 wake-up from mouse or keyboard activity are simple and reliable and utilize very few components. Note that the detect and wake-up circuits can also be implemented internal to the chipset itself or on the motherboard. The embodiments described herein exploit the use of power control signals generated by the chipset and a mouse or keyboard resume event. Note that the approach for waking up from the S3 state can be extended to system wake-up from other ACPI Power Management states as well.

An appropriate implementation (all combinational logic or using D flip-flops) should be selected for generating the wake-up signal based upon the chipset timing requirements for the S3 wake-up event and the actual delay between the wake-up event to PWRON# assertion.

Thus, a power management system has been described for detecting existence of the S3 state and causing a wake-up signal to be generated on the occurrence of a wake-up event. The embodiments described are intended to be illustrative and are not intended to limit the scope of the invention as set forth in the following claims. For example, many other digital designs can be conceived based on the teachings herein that would provide the appropriate signals indicating the S3 state and/or a wake-up signal. Other variations and modifications of the embodiments disclosed herein, may be made based on the description set forth herein, without departing from the scope and spirit of the invention as set forth in the following claims.

What is claimed is:

1. A method comprising:
   detecting a power management state according to a value of a first power control signal indicative of a power state for main power for a computer system and according to a value of a second power control signal indicative of a power state for system memory; and
   supplying a power management state signal indicative thereof.

2. The method as recited in claim 1 wherein the power management state detected is a suspend to RAM (S3) power state.

3. The method as recited in claim 2 further comprising responding to the existence of a resume event to generate a wake-up signal during the suspend to RAM power state.

4. The method as recited in claim 3 wherein the resume event is indicated by one or more signals indicative of activity, respectively, of one or more peripheral devices.

5. The method as recited in claim 4 wherein at least one of the one or more peripheral devices is a mouse or a keyboard.

6. The method as recited in claim 3 further comprising supplying the wake-up signal to an integrated circuit that generates the first and second power control signals.

7. The method as recited in claim 4 wherein the one or more signals indicative of peripheral activity are clock signals.

8. An apparatus comprising:
a first circuit coupled to logically combine a first power control signal indicative of a power state for main power of a computer system and a second power control signal indicative of a power state for system memory and to generate an indication of detection of a power management state.

9. The apparatus as recited in claim 8 wherein the power management state is a suspend to RAM power state in which system context is stored in the system memory.

10. The apparatus as recited in claim 9 wherein the first circuit is further coupled to receive one or more signals indicative of activity of one or more peripheral devices and to supply a wake-up signal in response thereto.

11. The apparatus as recited in claim 10 wherein at least one of the one or more peripheral devices is a mouse or a keyboard.

12. The apparatus as recited in claim 10 wherein the first circuit is disposed in an integrated circuit that generates the first and second power control signals.

13. The apparatus as recited in claim 10 wherein the one or more peripheral signals indicative of peripheral activity are clock signals.

14. The apparatus as recited in claim 13 wherein the first circuit includes one or more storage elements clocked respectively by one or more of the clock signals.

15. The apparatus as recited in claim 14 wherein the wake-up signal is independent of a period of the one or more clock signals.

16. The apparatus as recited in claim 10 wherein the first circuit includes only combinatorial logic coupled to logically combine the one or more signals with the indication of detection of the power management state.

17. The apparatus as recited in claim 10 wherein the first circuit is disposed on a motherboard of a computer system independent of the integrated circuit supplying the first and second power control signals.

18. The apparatus as recited in claim 17 wherein the computer system includes a central processing unit.

19. The apparatus as recited in claim 10 wherein the first circuit is disposed in a computer system that includes a central processing unit.

20. An apparatus comprising:
means for detecting the existence of a save to RAM power management state in a computer system according to a first power control signal indicative of a power state for main power of a computer system and a second power control signal indicative of a power state for system memory; and
means for generating a wake-up event in response to one or more signals indicative of a resume event.

* * * * *